United States Patent [19]

Cigna et al.

[11] Patent Number: 5,591,959
[45] Date of Patent: Jan. 7, 1997

[54] RADIATION DETECTION DEVICE HAVING ABUTTING DETECTION ELEMENTS AND PROCESS FOR THE PRODUCTION OF SAID DEVICE

[75] Inventors: Jean-Charles Cigna, Villard de Lans; Claudine Petitprez, Lancey; François Marion, Saint Egreve; Michel Ravetto, Meylan, all of France

[73] Assignee: Commissariat a l'Energie Atomique, Paris, France

[21] Appl. No.: 331,369

[22] Filed: Oct. 27, 1994

[30] Foreign Application Priority Data

Nov. 17, 1993 [FR] France ................................ 93 13721

[51] Int. Cl.⁶ .................................................. H01L 27/00
[52] U.S. Cl. ........................... 250/208.1; 250/208.6; 250/332; 257/777; 257/443
[58] Field of Search ........................... 250/208.1, 208.2, 250/208.6, 214.1, 332, 349; 257/777, 778, 443, 444; 358/482; 348/294; 437/205, 208

[56] References Cited

U.S. PATENT DOCUMENTS

| | | | |
|---|---|---|---|
| 4,463,262 | 7/1984 | Contreras | 250/349 |
| 4,675,535 | 6/1987 | Tsunekawa et al. | 250/208.1 |
| 4,695,716 | 9/1987 | Tandon et al. | 250/211 R |
| 4,695,861 | 9/1987 | Paine et al. | |
| 4,807,021 | 2/1989 | Okumura | 257/777 |
| 4,987,295 | 1/1991 | Kinnard et al. | 250/208.1 |
| 5,065,245 | 11/1991 | Carnell, Jr. et al. | |
| 5,120,960 | 6/1992 | Halvis | 250/338.4 |
| 5,313,055 | 5/1994 | Shiratsuki et al. | 250/208.1 |

FOREIGN PATENT DOCUMENTS

| | | |
|---|---|---|
| 0201396 | 12/1986 | European Pat. Off. |
| 2644632 | 9/1990 | France |
| 61-231757 | 10/1986 | Japan |

OTHER PUBLICATIONS

Vural, Kadri. "Mercury cadmium telluride short– and medium–wavelength infrared staring focal plane arrays." *Optical Engineering*, Mar. 1987, No. 3, pp. 201–208.

Primary Examiner—Edward P. Westin
Assistant Examiner—Stephen Calogero
Attorney, Agent, or Firm—Pearne, Gordon, McCoy & Granger

[57] ABSTRACT

The device includes at least two abutting detection elements (16, 18) having, on one face, a plurality of photodetectors (22, 24). A complementary detection element (26) has, on one face, a plurality of detectors (28) and is positioned astride the two abutting elements. The photodetectors of said complimentary element are positioned facing the faces of the two abutting elements and have no photodetector facing the photodetectors of the complementary element. The invention is useful in thermal imaging.

6 Claims, 3 Drawing Sheets

RADIATION DETECTION DEVICE HAVING ABUTTING DETECTION ELEMENTS AND PROCESS FOR THE PRODUCTION OF SAID DEVICE

BACKGROUND OF THE INVENTION

The present invention relates to a radiation detection device having abutting or butting detection elements, as well as to a process for the production of said device.

The invention more particularly applies to the production of very long linear optical detection arrays, particularly for thermal imaging.

In the field of optical signal detection, it has progressively become necessary to produce ever larger components. For example, one of the major objectives of manufacturers is to manufacture very long linear photodetector arrays having more than 1000 pixels in line.

The high number of reading pixels required for such "array" type detectors excludes the manufacture of monolithic components for reasons of the fault rate and the limited sizes of the substrates on which said detectors are manufactured.

The most widely used procedure for producing very long photodetector arrays is the so-called butting or abutting method, which is e.g. described in the article "Recent developments on 12.5 μm infrared detection buttable linear arrays", whose authors are J. P. Chamonal, C. Lucas, P. Bouchut, D. Blachier and P. Angelbaut, published in the Proceedings of SPIE Infrared Detectors and Focal Plane Arrays, vol. 1685 on 23.4.1992.

This method consists of juxtaposing on an interconnection substrate elementary photodetector arrays without any pixel loss, the total size of the equivalent array then no longer being limited by the aforementioned factors, namely the fault rate and the limited size of the substrates on which the photo-detectors are manufactured.

One of the possible abutting methods consists of producing detection elements or components incorporating photodetectors or pixels and cutting the ends of said components as close as possible to their end pixels in order to be able to mechanically juxtapose these components whilst maintaining the detection step size.

One of the methods permitting such a juxtapositioning is the so-called flip-chip hybridization method, according to which the components are hybridized by welding balls on an interconnection network support or on a reading circuit. In this case, the components receive the radiation to be detected by their rear faces.

The major difficulty of such methods is the cutting of the components without deteriorating the pixels close to the edge of the cuts or recesses (due to mechanical stresses inevitably caused by the cutting operation).

FIG. 1A is a diagrammatic view of two abutting detection elements 2, 4 hybridized on an interconnection network support 6 according to the flip-chip hybridization method.

FIG. 1B is the section I—I of FIG. 1A.

SUMMARY OF THE INVENTION

FIGS. 1A and 1B show a row of photodetectors 8 of the element 2 and a row of photodetectors 10 of the element 4.

In FIG. 1B a wavy arrow E illustrates the illumination by the rear face of the elements 2 and 4 (which are made from a material transparent to the radiation which it is wished to detect).

FIGS. 1A and 1B have electrically conductive microballs or microspheres 12 permitting the hybridization of the elements 2 and 4 on the support 6, as well as the connection of the photodetectors 8 and 10 to connection conductors 14 associated therewith on the support 6.

In FIG. 1A, reference D represents the optical size of the photodetectors (which are e.g. photodiodes) and reference g represents the minimum distance between two adjacent cut edges, said distance being imposed by mechanical considerations (cutting precision, positioning precision of contiguous chips).

The reduction of the step of the pixels renders insurmountable the difficulty mentioned hereinbefore (cutting the components without deteriorating the pixels located close to the cut edges), when it can be demonstrated that the distance between the cut edges and the outer edges of the pixels closest to said cut edges cannot be less than a distance designated L in FIG. 1A.

With the notations used, the detection step P (i.e. the repetition step of the pixels) is at least equal to:

$$P=D+2L+g.$$

The reduction of the detection step then leads to reduced and possibly zero pixels sizes D if the values of L and g imposed by the different technologies are high.

The present invention aims at obviating the aforementioned disadvantages by proposing a photodetection device which can have a very considerable length, as well as a process for the production of said device, the invention avoiding the deterioration of pixels of photodetection elements close to the edges of the cuts or recesses.

More specifically, the present invention relates to a radiation detection device incorporating at least two abutting detection elements, each element being made from a material transparent to the radiation and having, on one face, a plurality of photodetectors able to detect the radiation, said device being characterized in that it also comprises, for both abutting elements, a complentary detection element having, on one face, a plurality of photodetectors able to detect the radiation, in that said complementary element is placed astride the two abutting elements, the photodetectors of said complementary elements being positioned facing said faces of the two abutting elements, and in that said two abutting elements have no photodetector facing the photodetectors of the complementary element.

According to a preferred embodiment of said device, it also has a substrate with at least one opening able to receive the complementary element, the two abutting elements being hybridized on the substrate by electrically conductive balls and the complementary detection element is connected to the substrate by means of electrical connections formed on the abutting elements and the electrically conductive balls.

The substrate can have a single opening, able to receive each complementary element, or a plurality of openings, each of them being able to receive one complementary element.

Each of the abutting elements, as well as the corresponding complementary element can comprise a row of photodetectors having a given step or spacing, the number of detectors of the complementary element being chosen so as to obtain, when said complementary element is placed astride the corresponding abutting elements, a single row of photodetectors having said given step or spacing.

The invention also relates to a process for the production of the device according to the invention, incorporating said substrate, said process being characterized in that it comprises the following stages:

the substrate provided with said opening is made, the abutting detection elements are hybridized on said substrate and the complementary element is assembled with the thus obtained structure through the opening of the substrate.

The present invention permits an abutment (without any geometrical limitation of the size of the photodetectors) of an unlimited number of detection elements.

The invention also permits the step or spacing of the photodetectors to be equal to D (optical size of the photodetectors).

The invention also makes it possible to remove by a chosen distance the abutting edges from the edges of the first useful photodetectors.

BRIEF DESCRIPTION OF THE DRAWINGS

The present invention is described in greater detail hereinafter relative to non-limitative embodiments and with reference to the attached drawings, wherein show.

DESCRIPTION OF THE PREFERRED EMBODIMENTS

Figure 1A:
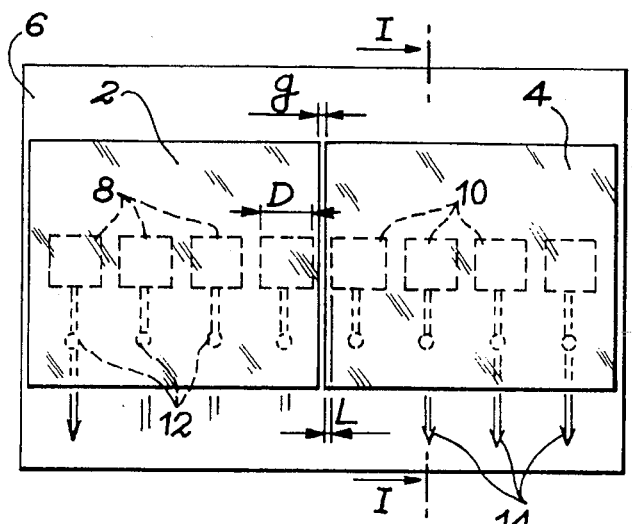
FIG. 1A A diagrammatic plan view of a known and already described radiation detection device.
Figure 1B:
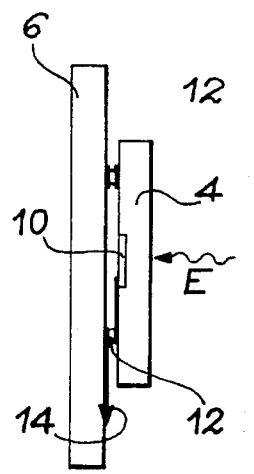
FIG. 1B Section I—I of FIG. 1A and which has already been described.

The radiation detection device according to the invention diagrammatically shown in FIGS. 2A to 2D results from a three-dimensional hybridization of photodetection elements.

Given the abutting or butting elements, there has been an addition of another element in accordance with an axis perpendicular to the plane defined by the abutting elements, said other element being positioned level with the junction between the two abutting elements.

More specifically, the device of FIGS. 2A to 2D comprises a plurality of detection elements (two in the example shown), which respectively carry the references 16 and 18, as well as an interconnection network support 20.

Each of the elements 16 and 18 is made from a material transparent to the radiation R to be detected and has, on one face, a row of photodetectors able to detect said radiation and e.g. being photodiodes.

The photodetectors of element 16 carry the reference 22, whilst the photodetectors of element 18 carry the reference 24.

The device of FIGS. 2A to 2D also comprises a complementary detection element 26 having, on one face, a row of photodetectors 28 able to detect the radiation and said complementary element is placed astride the two abutting elements 16, 18.

The photodetectors 28 of the element 26 face the faces of the two elements 16 and 18, the photodetectors 22, 24 being formed on said faces. The detection elements 16 and 18 are abutted in standard manner on the interconnection substrate 20. These two abutting elements 16, 18 have no photodetector facing the photodetectors 28 of the complementary element 26. The photodetectors 28 of said element 26 serve as the end photodetectors of the prior art detection elements.

As will be shown in greater detail hereinafter, the elements 16 and 18 are hybridized by welding balls on the substrate 20 and the complementary element 26 is hybridized on the elements 16 and 18 by welding balls, through a longitudinal opening 30 in the interconnection network support.

As will become more clear hereinafter, the photodetectors 28 of the element 26 are connected to the interconnection network support 20 by electrical connections, which are formed on the elements 16 and 18, and welding balls.

The complementary detection element 26 comprises, in the represented embodiment, more than two photodetectors.

However, in other embodiments, it could have only two photodetectors and they would play the part of the two photodetectors of the known devices and which are respectively located at the edge of the two abutting elements.

The more photodetectors the complimentary element has (replacing the photodetectors of the abutting elements) the more it is possible to move the cut edge of said abutting elements of the first photodetectors away from said detection elements.

Figure 2A:
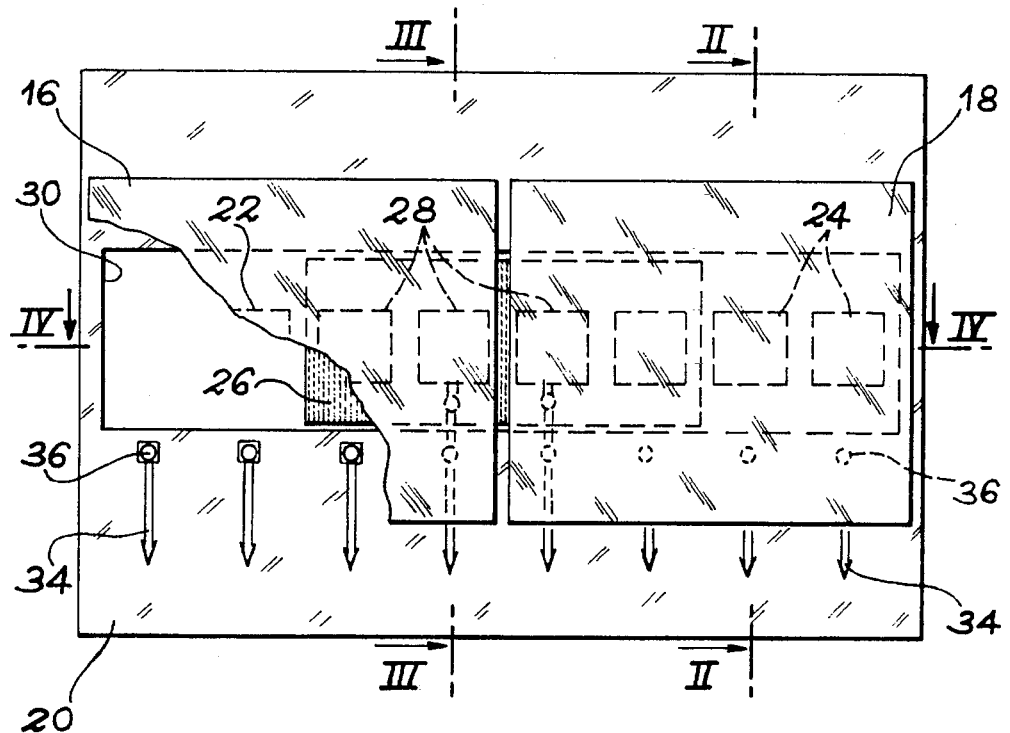
FIG. 2A A diagrammatic plan view of a radiation detection device according to the invention.
Figure 2B:
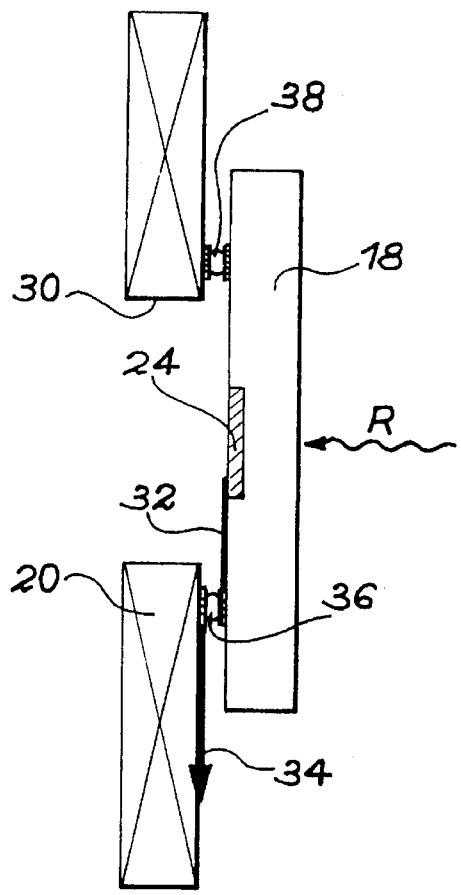
FIG. 2B Section II—II of FIG. 2A.
Figure 2C:
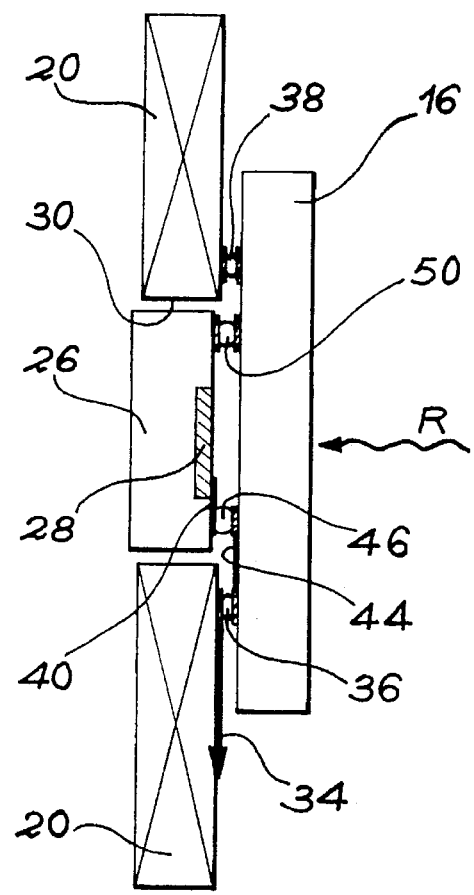
FIG. 2C Section III—III of FIG. 2A.
Figure 2D:
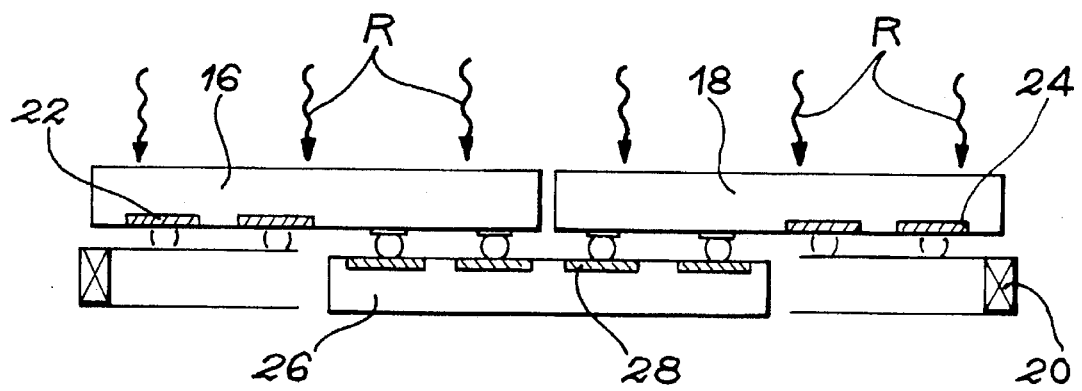
FIG. 2D Section IV—IV of FIG. 2A.

FIGS. 2B, 2C and 2D show that the illumination of the device takes place by the rear face of the elements 16 and 18 and no photodetector is present, on these elements 16 and 18, at the junction between them. Thus, the radiation R to be detected traverses said elements 16 and 18 in order to illuminate the photodetectors of the complementary element 26 (which constitutes a type of detection bridge).

FIG. 2D also shows that the radiation R traverses the elements 16 and 18 and reaches the photodetectors 22, 24 of said elements, which absorb said radiation.

In a purely indicative and in no way limitative manner, it is possible to produce a device according to the invention constituted by an array of 2000 pixels with a pixel step P of 25 μm, the optical size D of the pixels being 18 μm and the minimum geometrical distance g between the cut edges being 3 μm.

In this case, the maximum permitted deterioration distance L is:

$$L=(P-(D+g))/2=2 \text{ μm}$$

If the real distance L is 4 μm, the specifications cannot be satisfied without reducing the size of the photodetectors to the value:

$$D=P-(2L+g)=14 \text{ μm,}$$

which considerably reduces the size of the pixels compared with the value of the step size.

With the present invention it is possible to produce a pixel of the same size with the step being 25 μm.

The various electrical connections of the photodetectors of the device of FIGS. 2A to 2D will now be defined. Each photodetector of the element 18, such as e.g. the photodetector 24 (FIG. 2B), is provided with an electrical connection conductor 32 located on the corresponding element and is associated with an electrical connection conductor 34 located on the interconnection network support 20, said conductors 32, 34 being electrically connected by means of a welding ball 36, said balls 36 being located in the vicinity of the edge of the opening 30 in the embodiment shown.

Other welding balls 38 in the vicinity of the other edge of said opening are respectively positioned facing the balls 36 and permit the fixing of the element 18 to the support 20.

Each photodetector 28 of the complementary element 26 (FIG. 2C) is provided with an electrical connection conductor 40 placed on the front face of the element 26 and associated with an electrical connection conductor 34 on the support 20.

Another electrical connection conductor 44 is associated with said conductor 40 and is placed on the front face of the photodetection element 16 in front of which is located the photodetector 28.

A welding ball 46 makes it possible to connect the conductor 40 to the conductor 44 and the latter is connected to the conductor 34 by means of a welding ball 36, as can be seen in FIG. 2C.

In the represented embodiment, other welding balls 50, positioned facing the balls 46, opposite with respect thereto compared with the photodetectors 28 permit the fixing of the element 26 to the elements 16 and 18.

A process for the production of the device of FIGS. 2A to 2D will now be described.

With regards to the flip-chip hybridization, the manner of producing the welding balls is well known from the prior art.

These balls can e.g. be obtained by the electrolytic growth of a material layer with a low melting point above a wettable surface (e.g. a gold surface).

The balls 36 and 38 are produced on the interconnection network support 20, which can e.g. be made from silicon, alumina or any other material appropriate for this type of substrate (whose opening is made in known manner). Balls 46 and 50 are produced on elements 16 and 18 and/or the complementary element 26. When these balls have been formed, the flip-chip hybridization takes place of the abutting elements 16 and 18 on the perforated support 20.

This is followed by the hybridization of the complementary element 26 (after turning round the assembly formed by the support 20 and the abutting elements 16 and 18). The element 26 is hybridized through the opening 30.

It is optionally possible to bring into the same plane the surfaces of the abutting detection elements 16, 18 and the complementary element 26, if machining takes place beforehand of cavities in the substrates (elements, support) for receiving the balls in order to house the latter in said cavities.

FIG. 2D shows that the pixels of the complementary element 26 are illuminated by the radiation R through a material thickness identical to that of the material of the abutting elements (necessarily it is one of these two abutting elements which is traversed by the radiation).

Figure 3:
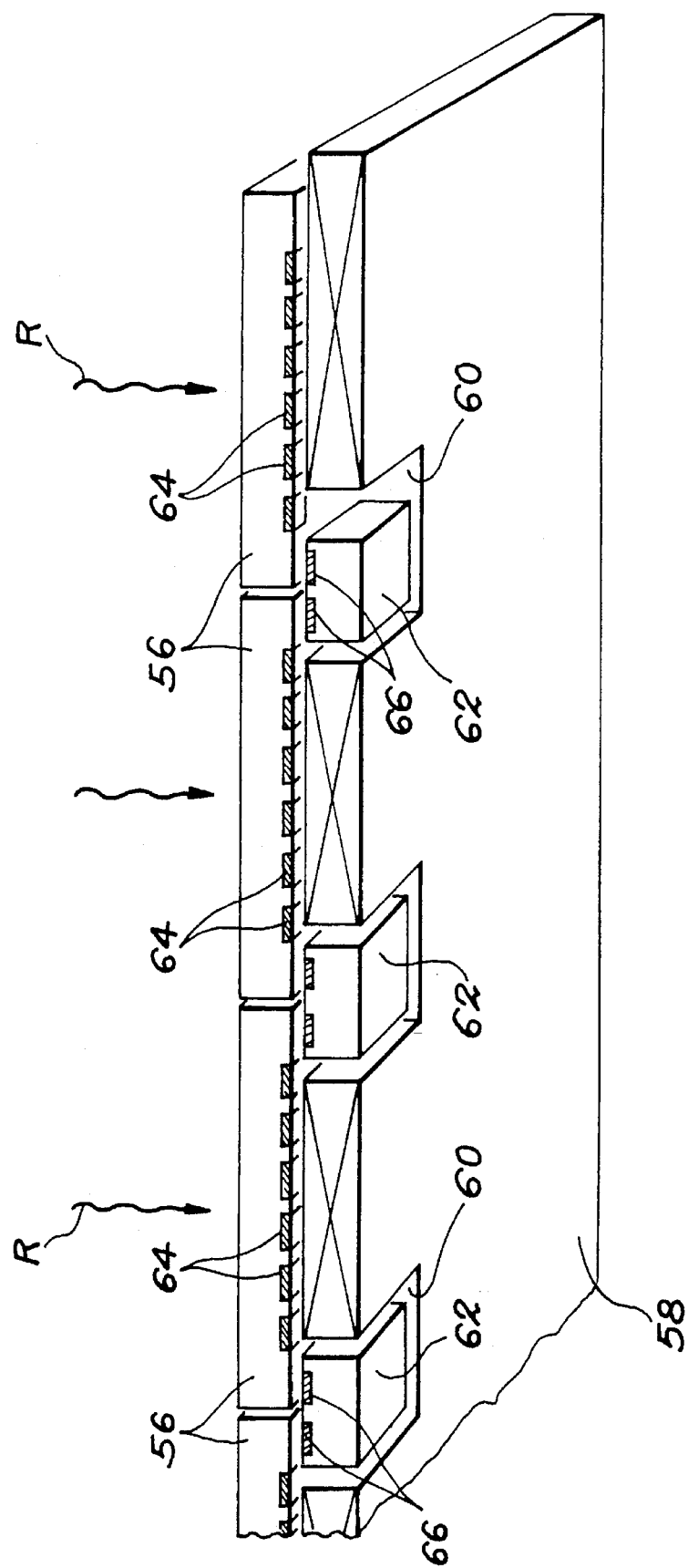
FIG. 3A diagrammatic, partial perspective view of another detection device according to the invention.

Another device according to the invention is shown diagrammatically in perspective in FIG. 3 and comprises a plurality of abutting detection elements 56 hybridized on an interconnection network support 58. The latter has openings 60 facing junctions of the abutting elements 56 and complementary detection elements 62 are placed in these openings.

Each element 56 (which is made from a material transparent to the radiation R to be detected) comprises a row of photodetectors 64 and each complementary element 62 comprises a plurality of photodetectors 66, on its face which faces the faces of the abutting elements 56 and on which the photodetectors 64 are located. These elements 56 have no photodetector facing the photodetectors 66 of the complementary elements 62.

The balls used for the hybridization of the various elements are not shown.

In the embodiment shown in FIG. 3, each complementary element 62 only has two photodetectors 66. In this case said two photodetectors replace the absent photodetectors of the elements 56, on the edge of said elements 56, and make it possible to reestablish the continuity of the rows of photodetectors 64.

This represents the equivalent of a very long array of reciprocally regularly spaced photodetectors.

In another, not shown embodiment, the support 58 only has a single longitudinal opening, which houses the complementary elements 62.

We claim:

1. Radiation detection device incorporating at least two detection elements (16, 18, 56) each having edges and faces, each element being made from a material transparent to the radiation and having, on one face, a plurality of photodetectors (22, 24, 64) able to detect the radiation, sets of two detection elements abutting along corresponding edges so that the faces of the abutting elements are substantially coplanar, said device being characterized in that the device also comprises, for any set of two abutting elements, a complementary detection element (26, 62) having, on one face, a plurality of photodetectors (28, 66) able to detect the radiation, in that said complementary element is placed astride the two abutting elements, the photodetectors of said complementary element being positioned facing said faces of the two abutting elements, and in that said two abutting elements have no photodetector facing the photodetectors of the complementary element.

2. Device according to claim 1, characterized in that the device also comprises a substrate (20, 58) having at least one opening (30, 60), said opening being able to receive the complementary element, in that the two abutting elements are hybridized on the substrate by electrically conductive balls (36, 38) and in that the complementary detection element is connected to the substrate by means of electrical connections (44) formed on the abutting elements and by means of electrically conductive balls (36, 46).

3. Device according to claim 2, characterized in that the substrate comprises a single opening (30) able to receive each complementary element (26).

4. Device according to claim 1, characterized in that each of the abutting elements, as well as the corresponding complementary element comprise a row of photodetectors having a given step size and in that the number of photodetectors of the complementary element is chosen so as to obtain, when said complementary element is placed astride the corresponding abutting elements, a single row of photodetectors having said given step size.

5. Process for the production of the device according to claim 2, characterized in that the process comprises the following stages:

the substrate (20) provided with the opening (30) is produced, the abutting detection elements (16, 18) are hybridized on said substrate, and the complementary element (26) is assembled with the thus obtained structure through the opening (30) of the substrate (20).

6. Device according to claim 1, characterized in that a substrate on which the abutting elements are disposed comprises a plurality of openings (60), each being able to receive one complementary element (62).

* * * * *